US011193797B2

(12) United States Patent
Lamesch (10) Patent No.: US 11,193,797 B2
(45) Date of Patent: Dec. 7, 2021

(54) ROBUST, LOW-COST CAPACITIVE MEASUREMENT SYSTEM

(71) Applicant: IEE INTERNATIONAL ELECTRONICS & ENGINEERING S.A., Echternach (LU)

(72) Inventor: Laurent Lamesch, Reichlange (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 83 days.

(21) Appl. No.: 16/482,073

(22) PCT Filed: Jan. 31, 2018

(86) PCT No.: PCT/EP2018/052360
§ 371 (c)(1),
(2) Date: Jul. 30, 2019

(87) PCT Pub. No.: WO2018/141773
PCT Pub. Date: Aug. 9, 2018

(65) Prior Publication Data
US 2020/0116530 A1 Apr. 16, 2020

(30) Foreign Application Priority Data
Jan. 31, 2017 (LU) ........................................ 100036

(51) Int. Cl.
*G01D 5/24* (2006.01)
*G01R 19/00* (2006.01)
*H03F 3/45* (2006.01)

(52) U.S. Cl.
CPC ........... *G01D 5/24* (2013.01); *G01R 19/0092* (2013.01); *H03F 3/45475* (2013.01); *H03F 2200/261* (2013.01); *H03F 2203/45138* (2013.01)

(58) Field of Classification Search
CPC .............................. G01D 5/24; G01R 19/0092
See application file for complete search history.

(56) References Cited

U.S. PATENT DOCUMENTS

| 4,386,232 A * | 5/1983 | Slater .................... G06F 3/0488 345/173 |
| 6,392,542 B1 | 5/2002 | Stanley |

(Continued)

FOREIGN PATENT DOCUMENTS

| LU | 92299 B1 * | 10/2013 | ........... H03K 17/955 |
| LU | 92299 A1 | 12/2015 | |

(Continued)

OTHER PUBLICATIONS

International Search Report corresponding to International Application No. PCT/EP2018/052360, dated May 22, 2018, 3 pages.

(Continued)

*Primary Examiner* — Dominic E Hawkins
(74) *Attorney, Agent, or Firm* — Reising Ethington P.C.

(57) ABSTRACT

A complex current measurement circuit for a guard-sense capacitive sensor includes a periodic signal voltage source, a differential transimpedance amplifier circuit (DTA) and a demultiplexer circuit (DMX). At least one sense antenna electrode of the capacitive sensor is electrically connectable to a signal input line of the DMX which has signal output lines electrically connected to differential signal input lines of the DTA. The DTA includes operational amplifiers having input ports each electrically connected to one of the signal output lines. For each differential signal input line, either a capacitor is electrically connected between an output port of the voltage source and the differential signal input line, wherein an impedance of the capacitor is close to zero Ohm, or a galvanic connection is provided to one of the signal output lines. An output signal provided by the DTA is usable (Continued)

for determining a complex sense current of the capacitive sensor.

11 Claims, 3 Drawing Sheets

(56) References Cited

U.S. PATENT DOCUMENTS

| | | | |
|---|---|---|---|
| 6,703,845 | B2 | 3/2004 | Stanley et al. |
| 7,521,940 | B2 | 4/2009 | Koch et al. |
| 8,354,936 | B2 | 1/2013 | Ootaka |
| 2009/0295199 | A1 | 12/2009 | Kincaid et al. |
| 2013/0141121 | A1* | 6/2013 | Lamesch ............ G01R 27/2605 324/681 |
| 2013/0176039 | A1* | 7/2013 | Lamesch ............ G01R 27/2605 324/683 |
| 2017/0305376 | A1 | 10/2017 | Lamesch |

FOREIGN PATENT DOCUMENTS

| | | |
|---|---|---|
| WO | WO9217344 A1 | 10/1992 |
| WO | WO9513204 A1 | 5/1995 |
| WO | WO2011154468 A1 | 12/2011 |
| WO | WO2016055667 A1 | 4/2016 |

OTHER PUBLICATIONS

Written Opinion corresponding to International Application No. PCT/EP2018/052360, dated May 22, 2018, 12 pages.

J. R. Smith et al., "Electric Field Sensing for Graphical Interfaces", IEEE Computer Graphics and Applications, vol. 18, No. 3, p. 54-60, dated in 1998.

* cited by examiner

ROBUST, LOW-COST CAPACITIVE MEASUREMENT SYSTEM

TECHNICAL FIELD

The present invention generally relates to the technical field of capacitive measurement circuits and, more specifically, to a capacitive measurement device having one or more electrodes, by which characteristics such as shape and location of an object with a complex permittivity different from an environment are determined by means of capacitive coupling via the object.

BACKGROUND OF THE INVENTION

Capacitive sensors and capacitive measurement and/or detection devices employing capacitive sensors have a wide range of applications, and are among others used for the detection of the presence and/or the position of a conductive body in the vicinity of an antenna electrode. As used herein, the term "capacitive sensor" designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which may be identical with or different from emitting antenna electrodes—at which the influence of an object or living being on the electric field is detected.

In some (so-called "loading mode) capacitive sensors, the at least one antenna electrode serve at the same time as sensing electrode. In this case, a measurement circuit determines a current flowing into the at least one antenna electrode in response to an oscillating voltage being applied to them. The relationship of voltage to current yields the complex impedance between the at least one antenna electrode and ground potential. In an alternative version of capacitive sensors ("coupling mode" capacitive sensors), the transmitting antenna electrode(s) and the sensing electrode(s) are separate from one another. In this case, the measurement circuit determines a current or voltage that is induced in the sensing electrode when at least one transmitting antenna electrode is being operated.

Different capacitive sensing mechanisms are for instance explained in the technical paper entitled "*Electric Field Sensing for Graphical Interfaces*" by J. R. Smith et al., published in IEEE Computer Graphics and Applications, 18(3): 54-60, 1998. The paper describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmitting electrode, building up an electric field to a receiving electrode, and the displacement current induced at the receiving electrode is measured. The measured displacement current depends on the body being sensed. In the "transmit mode", the transmit electrode is put in contact with the user's body, which then becomes a transmitter relative to a receiver, either by direct electrical connection or via capacitive coupling.

The capacitive coupling strength may e.g. be determined by applying an alternating voltage signal to an antenna electrode and by measuring the current flowing from that antenna electrode either towards ground (in the loading mode) or into a second antenna electrode (in coupling mode). This current may be measured by a transimpedance amplifier, which is connected to the sensing electrode and which converts the current flowing into the sensing electrode into a voltage proportional to this current.

Some capacitive sensors are designed as sense-only capacitive sensors having a single sense electrode. Also, quite often capacitive sensors are used that comprise a sense electrode and a guard electrode that are proximally arranged and mutually insulated from each other. This technique of "guarding" is well known in the art and is frequently used for intentionally masking, and thus shaping, a sensitivity regime of a capacitive sensor. To this end, the guard electrode is kept at the same electric AC potential as the sense electrode. As a result, a space between the sense electrode and the guard electrode is free of an electric field, and the guard-sense capacitive sensor is insensitive in a direction between the sense electrode and the guard electrode.

Capacitive occupant sensing systems have been proposed in great variety, e.g. for controlling the deployment of one or more airbags, such as e.g. a driver airbag, a passenger airbag and/or a side airbag. U.S. Pat. No. 6,161,070, to Jinno et al., relates to a passenger detection system including a single antenna electrode mounted on a surface of a passenger seat in an automobile. An oscillator applies on oscillating voltage signal to the antenna electrode, whereby a minute electric field is produced around the antenna electrode. Jinno proposes detecting the presence or absence of a passenger in the seat based on the amplitude and the phase of the current flowing to the antenna electrode.

U.S. Pat. No. 6,392,542 to Stanley teaches an electric field sensor comprising an electrode mountable within a seat and operatively coupled to a sensing circuit, which applies to the electrode an oscillating or pulsed signal having a frequency "at most weakly responsive" to wetness of the seat. Stanley proposes to measure phase and amplitude of the current flowing to the electrode to detect an occupied or an empty seat and to compensate for seat wetness.

Luxembourgian patent application LU 92 299 A1 describes a capacitive sensing system that comprises an antenna electrode and a control and evaluation circuit, which includes a differential transimpedance amplifier (DTIA). The DTIA comprises a first signal input, a second signal input, a control signal inputs and an output and is configured to drive into the first signal input a first current such that a first and a second voltage generated at the first and second signal input, respectively, follows the voltage applied to the control signal input and to generate on the output in output signal indicative of a difference between the first and second currents. A demultiplexer is provided to switch to the antenna electrode alternately to the first current input and to the second current input. An alternating reference voltage is generated at a reference voltage note that is operatively connected to the control signal input of the DTIA. The control and evaluation circuit comprises an error amplifier that generates on its output connected to the control signal input an error signal, which corresponds to an amplification of a voltage difference between the reference voltage node and the antenna electrode.

Others had the idea of using the heating element of a seat heater as an antenna electrode of a capacitive occupancy sensing system. International application WO 92/17344 A1 discloses an electrically heated vehicle seat with a conductor, which can be heated by the passage of electrical current, located in the seating surface, wherein the conductor also forms one electrode of a two-electrode seat occupancy sensor.

International application WO 95/13204 A1 discloses a similar system, in which the oscillation frequency of an oscillator connected to the heating element is measured to derive the occupancy state of the vehicle seat. More elaborate combinations of a seat heater and a capacitive sensor are disclosed, for instance, in U.S. Pat. Nos. 7,521,940 B2, 2009/0295199 A1 and 6,703,845.

By way of example, patent document U.S. Pat. No. 8,354,936 B2 describes a capacitive passenger detector for a vehicle. The capacitive passenger detector includes a main electrode, a sub-electrode and a guard electrode. The main electrode and the sub-electrode are separated apart from each other, and disposed in a seat of a vehicle. The guard electrode is disposed between the main electrode and a body of the vehicle, and separated apart from the main electrode. A sensitive characteristic measurement unit is configured for applying an alternating voltage signal to the main electrode, the sub-electrode and the guard electrode selectively or totally and for converting a current generated in the main electrode, the sub-electrode and the guard electrode to a voltage, respectively. The capacitive passenger detector further comprises a controller that defines a current flowing through the guard electrode to be a reference current when a voltage of the main electrode and a voltage of the guard electrode have the same potential. The controller defines a current flowing direction of the current flowing through the guard electrode to be a negative direction when the voltage of the main electrode is higher than the voltage of the guard electrode. The controller defines the current flowing direction of the current flowing through the guard electrode to be a positive direction when the voltage of the main electrode is lower than the voltage of the guard electrode. The controller corrects the voltage of the main electrode based on the current flowing through the guard electrode so that a corrected voltage of the main electrode is set to be a passenger determination data. Even when a potential difference is generated between the main electrode and the guard electrode, the controller detects the capacitance of the passenger correctly.

A challenging situation arises for capacitive sensing devices that are intended for vehicle applications and therefore have to comply with automotive rules and standards, for instance such as ISO 11451-4 (*Road vehicles-Vehicle test methods for electrical disturbances from narrowband radiated electromagnetic energy-Part 4: Bulk current injection (BCI)*). Capacitive sensing devices are easily disturbed by injected radio frequency (RF) currents during the BCI test.

Further, a capacitive sensing device with at least one sense electrode (in the following also denoted as "sense") and at least one guard electrode (in the following also denoted as "guard") has parasitic impedances, which systematically affect a measurement accuracy of an unknown impedance to be measured by determining a sense current flowing in the capacitive sensor. These impedances include, but are not limited to a sense-to-guard impedance, a guard-to-ground impedance, a sense-to-sense current measurement circuit impedance, and a guard-to-signal voltage source impedance.

SUMMARY

It is therefore an object of the invention to provide a current measurement circuit of a capacitive sensing device that is less susceptible to interference by injected RF currents, shows a reduced impact of a sense-to-guard impedance on the measurement accuracy and enables a fast determination of the complex sense current.

In one aspect of the present invention, the object is achieved by a complex current measurement circuit that is configured to determine a complex sense current of a guard-sense capacitive sensor operated in loading mode that includes a periodic signal voltage source, a differential transimpedance amplifier circuit and a demultiplexer circuit.

The periodic signal voltage source is configured for providing a periodic electrical measurement signal at an output port that is electrically connectable to at least one guard antenna electrode of the capacitive sensor.

The differential transimpedance amplifier circuit comprises at least one electronic amplifier, at least two differential signal input lines and at least one signal output.

The demultiplexer circuit includes a demultiplexer, a signal input line, a plurality of signal output lines and a local oscillator for controlling switching operation. At least one sense antenna electrode of the capacitive sensor is electrically connectable to the signal input line. Each one of the signal output lines is electrically connected to a different one the at least two differential signal input lines of the differential transimpedance amplifier circuit.

The demultiplexer circuit (DMX) includes three or four signal output lines and the differential transimpedance amplifier circuit (DTA) includes, in case of three signal output lines, three operational amplifiers having a signal input port each or, in case of four signal output lines, two differential amplifiers having two signal input ports each. Each signal output line is electrically connected to a different one of the signal input ports.

For each differential signal input line, either a capacitor is electrically connected between the output port of the periodic signal voltage source and the differential signal input line, wherein an impedance of the capacitor at an operating frequency of the electrical measurement signal is lower than a predetermined value that is close to zero Ohm, or a galvanic connection is provided to a different one of the signal output lines of the demultiplexer circuit.

An output signal provided at the at least one differential signal output of the differential transimpedance amplifier circuit is usable for determining the complex sense current.

The complex sense current is indicative of an unknown impedance that represents a position of an object relative to the at least one sense antenna electrode.

The phrases "configured to" and "configured for", as used in this application, shall in particular be understood as being specifically programmed, laid out, furnished or arranged.

The term "guard-sense capacitive sensor", as used in this application, shall in particular be understood as a capacitive sensor that includes at least one electrically conductive sense antenna electrode and at least one electrically conductive guard antenna electrode that are mutually galvanically separated from each other and that are usually arranged close to each other.

The phrase "electrically connectable/electrically connected", as used in this application, shall be understood to encompass galvanic electrical connections as well as electrical connections established by capacitive and/or inductive electromagnetic coupling.

It will be appreciated, that the electrical measurement signal is preferably but not necessarily a sine wave signal. In case of a sine wave signal, the operating frequency may e.g. be the fundamental frequency, i.e. a lowest sinusoidal frequency in a Fourier analysis of the periodic electrical measurement signal.

The capacitance of the capacitor is preferably selected such that an impedance at the operating or fundamental frequency is lower than 100 Ohm, preferably lower than 10 Ohm, more preferable lower than 1 Ohm and, most preferable, lower than 100 mOhm.

In the proposed complex current measurement circuit, the complex sense current is demultiplexed into the differential signal input of the differential transimpedance amplifier circuit. A voltage at the at least two differential signal input lines is kept at a potential of the at least one guard antenna electrode. By the proposed complex current measurement circuit, an impact of the sense-to-guard impedance on the measurement accuracy of a capacitive sensing device can substantially be reduced. Further, the proposed complex current measurement circuit is less susceptible to interference by RF currents such as RF currents injected in a BCI test. Moreover, the use of a demultiplexer circuit with three or four signal output lines and an appropriate number of operational amplifiers or differential amplifiers in the proposed complex current measurement circuit can enable a fast determination of the complex sense current. A complex current measurements with defined phase differences of signals at differential signal inputs of different electronic amplifiers can be enabled. In comparison with known complex current measurement circuits, this results in a faster determination of in-phase and quadrature phase portions of the complex sense current, which can be used to calculate the unknown impedance.

The current measurement circuit in accordance with the invention is in particular beneficially applicable in automotive applications which shall particularly be understood to encompass applications for passenger cars, trucks and buses.

It will be readily understood by those skilled in the art that the differential transimpedance amplifier circuit may further include a plurality of passive electronic components as external circuitry.

The at least one signal output of the differential transimpedance amplifier circuit is preferably formed as a differential signal output. However, it is also contemplated that the at least one signal output is designed as a single-ended output.

Preferably, the electrical measurement signal is formed as a sinusoidal voltage signal having a fundamental frequency in a range between 10 kHz and 100 MHz. By that, a layout of the complex current measurement circuit can be enabled that is balanced between hardware effort and sensitivity required by the specific application.

Preferably, the differential transimpedance amplifier circuit includes two or more operational amplifiers. This embodiment is also suited if no common-mode current suppression is required. Preferably, a difference of output lines of the two or more amplifiers is taken for further signal processing.

In suitable embodiments, the use of two or more amplifiers in the differential transimpedance amplifier circuit can enable to install two complex current measurement paths to operate in parallel.

It will be appreciated that, when the demultiplexer circuit includes a plurality of three or four signal output lines, the operating or fundamental frequency of the electrical measurement signal may be either equal to a switching operation frequency of the demultiplexer circuit (DMX) within predetermined tolerance margins or the operating or fundamental frequency of the electrical measurement signal may differ from a switching operation frequency of the demultiplexer circuit (DMX) by a predetermined amount that is different from zero. In the former case, complex current measurements with defined phase differences between the electrical measurement signal and the local oscillator can be enabled. In the latter case, an intermediate frequency equal to the difference of the two frequencies is generated at the differential signal output of the differential transimpedance amplifier circuit. The existence of the intermediate frequency can beneficially be used to eliminate DC offset voltages in the signal.

Preferably, the predetermined tolerance margins may be lower than 0.1%. For instance for a typical frequency of 7 MHz, a measurement time of 10 ms, and a phase error of 1 degree, the maximum frequency difference is 0.28 Hz, which is 0.04 ppm.

In preferred embodiments of the complex current measurement circuit, the differential transimpedance amplifier circuit includes at least one current conveyor analog electronic device.

Current conveyor analog electronic devices (or short: current conveyors) are known in the art in various types (types I, II and III). A current conveyor is a three-terminal (X, Y, Z) analogue electronic device. For instance the current conveyor of type II (short: CCII) can formally be described by the following equation.

$$\begin{bmatrix} i_y \\ v_x \\ i_z \end{bmatrix} = \begin{bmatrix} 0 & 0 & 0 \\ 1 & 0 & 0 \\ 0 & \pm 1 & 0 \end{bmatrix} \begin{bmatrix} v_y \\ i_x \\ v_z \end{bmatrix}$$

i.e. $i_y = 0$
$v_x = v_y$
$i_z = \pm i_x$

The sign in front of $i_x$ relates to CCII+ and CCII−, respectively.

Properties of the considered current conveyors are described for instance in K. C. Smith and A. S. Sedra, "*The Current Conveyor-A New Building Block*" IEEE Proc., 56, pp 1368-1369, 1968, and in Sedra A., Smith K., "*A second-generation current-conveyor and its applications*", IEEE Trans., vol. CT-17, pp 132-134, 1970. These documents shall hereby be incorporated by reference in its entirety with effect for the jurisdictions permitting incorporation by reference.

The use of at least one current conveyor in the differential transimpedance amplifier circuit can provide a substantially smaller AC input impedance to a signal output of the demultiplexer circuit and, by that, can allow to use capacitors of smaller capacitance values between the output port of the periodic signal voltage source and the differential signal input lines of the differential transimpedance circuit. Further, by the almost perfect input and output impedance properties of current conveyors, an overall performance improvement can be accomplished for the complex current measurement circuit.

Preferably, current conveyors of type II (CCII+ and/or CCII−) are used in the differential transimpedance amplifier circuit.

Preferably, the at least one current conveyor analog electronic device is built from discrete components. By this, an especially cost-effective solution for the complex current measurements can be provided.

In another aspect of the invention, a method is provided for determining a complex sense current of a guard-sense capacitive sensor operated in loading mode, using the proposed complex current measurement circuit, wherein the operating frequency of the electrical measurement signal is equal to an operating frequency of the local oscillator of the demultiplexer circuit within predetermined tolerance margins. The benefits described in context with the complex current measurement circuit apply to the method to the full extent.

The method comprises steps of providing a periodic electric measurement signal to at least one guard antenna electrode of the capacitive sensor, setting a phase difference between the periodic signal voltage source and a switching operation of the demultiplexer circuit (DMX) to a first phase value such that an absolute value of one of the phases is a priori known, then, determining a voltage or a voltage difference at the differential signal output line of the differential transimpedance amplifier circuit, then, setting a phase difference between the periodic signal voltage source and the switching operation of the demultiplexer circuit to a second phase value that is different from the first phase value, and then, determining a voltage or a voltage difference at the differential signal output line of the differential transimpedance amplifier circuit.

It is noted herewith that the terms "first" and "second" are used in this application for distinction purposes only, and are not meant to indicate or anticipate a sequence or a priority in any way.

By using the voltage differences determined at the two different phase differences, a value of the unknown complex impedance can be calculated.

In a further aspect of the invention, an alternative method is provided for determining a complex sense current of a guard-sense capacitive sensor operated in loading mode, using the proposed complex current measurement circuit, wherein the operating or fundamental frequency of the electrical measurement signal differs from an operating frequency of the local oscillator of the demultiplexer circuit by a predetermined amount that is different from zero. The benefit of using an intermediate frequency described in context with this complex current measurement circuit applies to the method to the full extent.

The method comprises steps of providing a periodic electric measurement signal to at least one guard antenna electrode of the capacitive sensor, then, determining a complex voltage difference at the differential signal output of the differential transimpedance amplifier circuit at a measuring frequency that is equal to a difference of the operating or fundamental frequency of the electrical measurement signal and the operating frequency of the local oscillator or a switching operation frequency of the demultiplexer circuit (DMX), then, electrically connecting a remotely-switchable reference impedance upstream of the signal input line of the demultiplexer circuit, and then, determining a complex voltage difference at the differential signal output of the differential transimpedance amplifier circuit at the measuring frequency.

Again, by using the voltage differences determined at the two different phase differences, a value of the unknown complex impedance can be calculated.

BRIEF DESCRIPTION OF THE DRAWINGS

Further details and advantages of the present invention will be apparent from the following detailed description of not limiting embodiments with reference to the attached drawing, wherein.

DESCRIPTION OF THE ILLUSTRATED EMBODIMENTS

Figure 1:
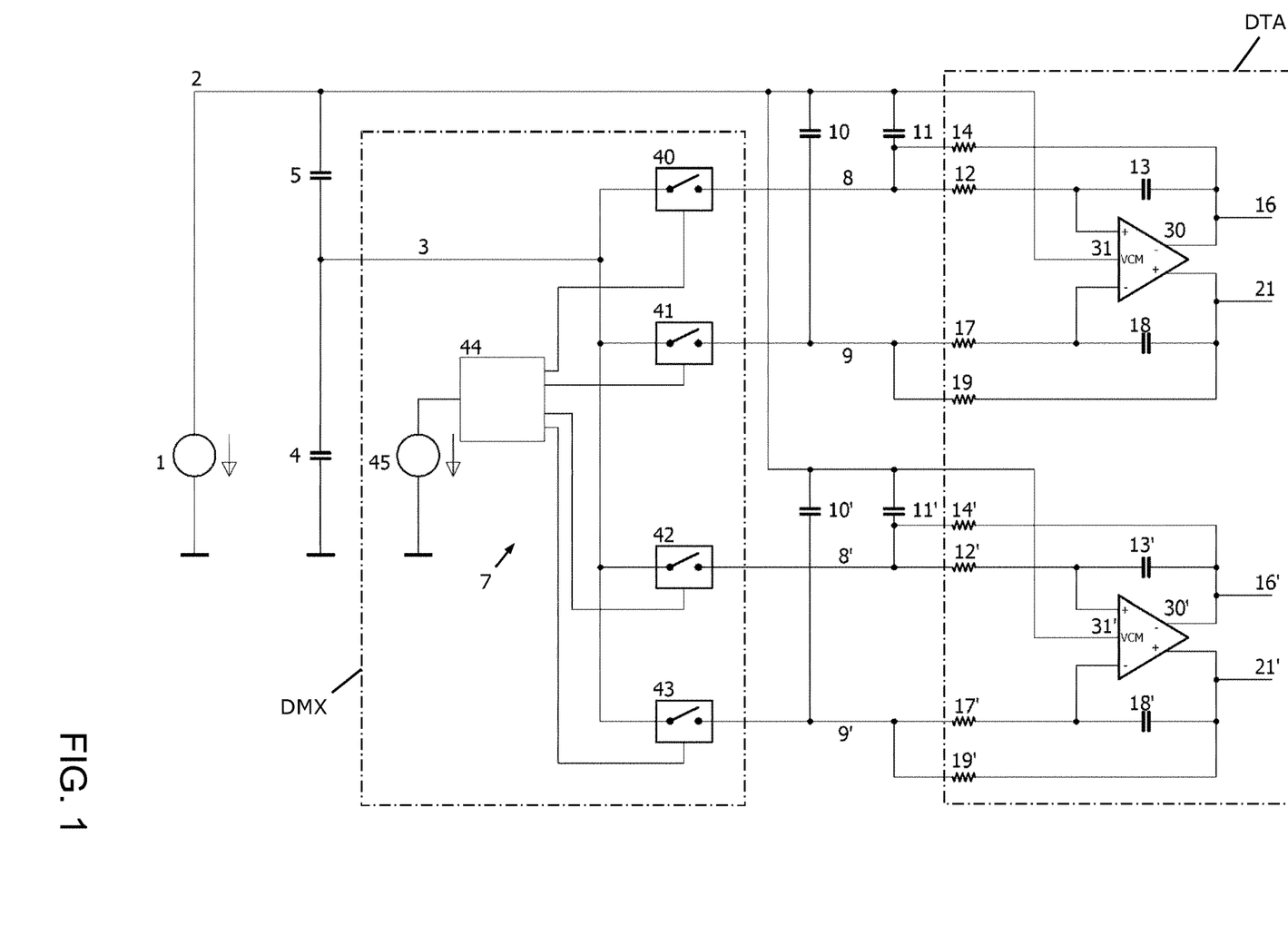
FIGS. 1 and 2 show layouts of possible embodiments of a complex current measurement circuit in accordance with the invention.
Figure 2:
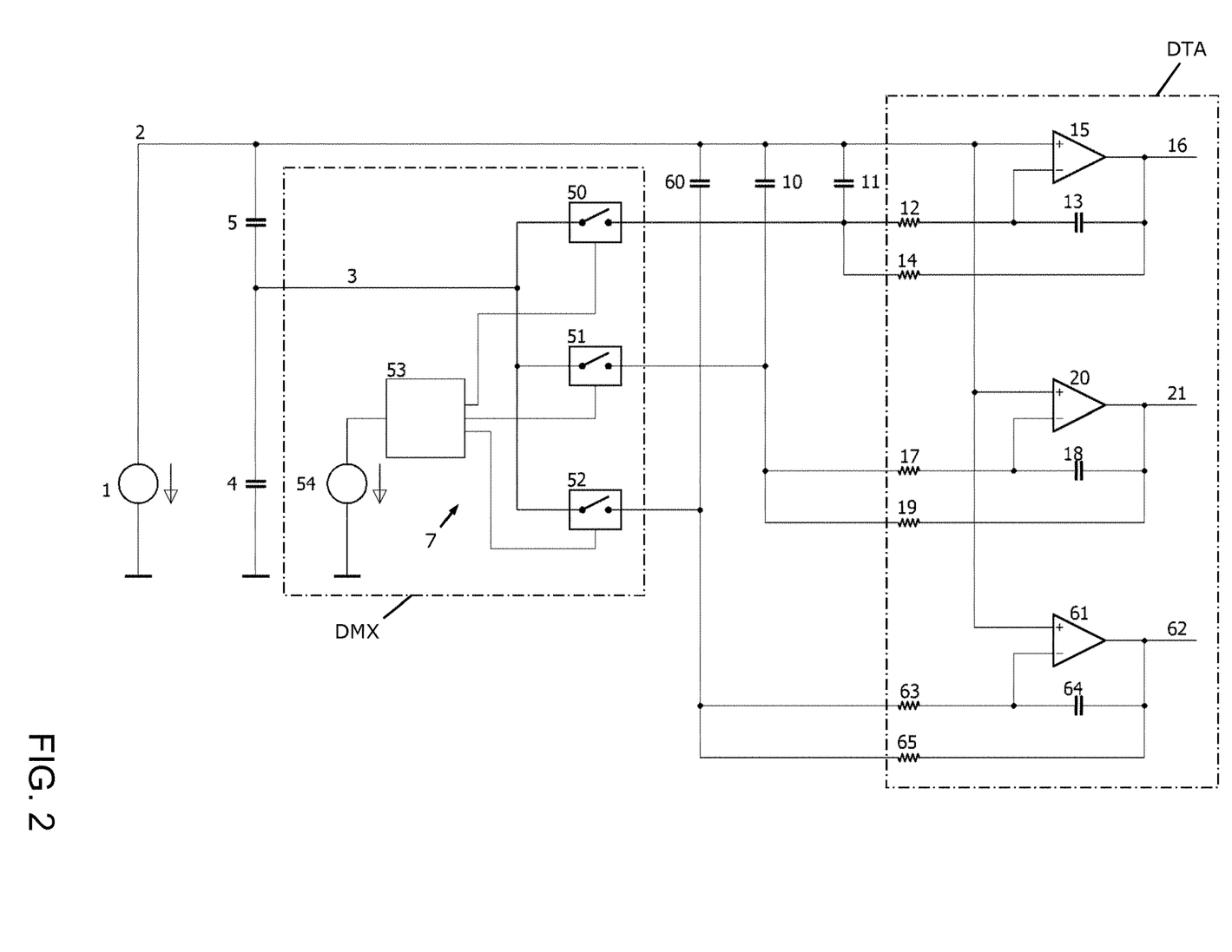

FIGS. 1 and 2 show layouts of possible embodiments of a complex current measurement circuit in accordance with the invention, configured to determine a complex sense current of a guard-sense capacitive sensor operated in loading mode.

The complex current measurement circuit comprises a periodic signal voltage source 1. It generates a periodic voltage, which in this specific embodiment is a sine wave with an operating or fundamental frequency between 10 kHz and 100 MHz, at an output port. The output port is electrically connected to a guard antenna electrode of the capacitive sensor at guard node 2.

The complex current measurement circuit further comprises a demultiplexer circuit DMX having a demultiplexer 7, a signal input line and a plurality of four signal output lines, and a differential transimpedance amplifier circuit DTA. The differential transimpedance amplifier circuit DTA includes four differential signal input lines 8, 8', 9, 9' and differential signal outputs 16, 16', 21, 21'. Each one of the signal output lines of the demultiplexer circuit DMX is electrically connected to a different one of the four differential signal input lines 8, 8', 9, 9' of the differential transfer impedance amplifier circuit DTA.

A sense antenna electrode of the capacitive sensor is electrically connected to the signal input line of the demultiplexer circuit DMX at sense node 3. A parasitic capacitance between the sense antenna electrode and the guard antenna electrode of the capacitive sensor is illustrated by a capacitor 5. An object approaching the sense antenna electrode is represented in the layout of FIG. 1 by an unknown impedance 4 (shown as a capacitor for reasons of simplicity, however, the unknown impedance 4 may as well have inductive and/or resistive components) that is connected to a ground potential.

The demultiplexer circuit DMX comprises a plurality of four signal output lines. The demultiplexer 7 is symbolized by four switches 40, 41, 42, 43 and a sequencer 44. The switches 40, 41, 42, 43 are turned on, one at a time, and one after the other by the sequencer 44, which is driven by the local oscillator 45. For instance, during a first quarter of the periodic electrical measurement signal, switch 40 is turned on. During the second quarter of the periodic electrical measurement signal, switch 42 is turned on. During the third quarter of the periodic electrical measurement signal, switch 41 is turned on. During the fourth quarter of the periodic electrical measurement signal, switch 43 is turned on. As a demodulator consisting of switches 40, 41 is operated with a phase difference of 90 degrees compared to a demodulator consisting of switches 42, 43, the output voltage differences between differential signal outputs 16, 21 and differential signal outputs 16', 21' can be considered to be the in-phase and the quadrature phase portions of the complex unknown current flowing through unknown impedance 4. The in-phase and the quadrature phase portions can then be used to calculate the value of the unknown impedance 4, as described above.

The two parallel demodulation paths allow the measurement of the real and imaginary parts of the unknown impedance 4 at the same time, thereby reducing the measurement time.

The switching frequency of the switches 40, 41, 42, 43 (i.e. one quarter of the frequency of the local oscillator 45) can be set either to the same frequency as the periodic signal voltage source 1, or a frequency difference can be introduced.

The differential transimpedance amplifier circuit DTA includes two differential amplifiers 30, 30' with common-mode voltage control input 31, 31' feedback capacitors 13, 13' 18, 18', feedback resistors 14, 14', 19, 19' and decoupling resistors 12, 12' 17, 17'. The differential transimpedance amplifier circuit DTA converts a difference of input currents into the differential signal input line 8, 8' and the differential signal input line 9, 9' into a voltage difference between the differential signal output 16, 16' and the differential signal output 21, 21'. The transimpedance is defined by the resistor 14, 14' and the resistor 19, 19', and the capacitor 13, 13' and the capacitor 18, 18'. Preferably, the resistor 14, 14' and the resistor 19, 19' have the same resistance value, and the capacitor 13, 13' and the capacitor 18, 18' have the same capacitance value. In addition, the differential transimpedance amplifier circuit DTA keeps the DC voltage difference between the differential signal input line 8, 8' and the differential signal input line 9, 9' at substantially zero V. In addition, it keeps the DC voltages at the differential signal input line 8, 8' and the differential signal input line 9, 9' substantially equal to the DC voltage at the common-mode voltage control input 31, 31'.

In order to substantially eliminate a deviation of the unknown complex current through complex impedance 4 into the parasitic capacitance 5, the AC input impedance of the complex current measurement circuit between the guard node 2 and the sense node 3 must be kept at substantially zero Ohms at the operating or fundamental frequency of the electrical measurement signal. This can be performed by keeping the voltages at the differential signal input line 8, 8' and the differential signal input line 9, 9' at substantially the same voltage as that at the guard node 2. There are two options to achieve this:

Option #1 (not shown in FIG. 1): Without the capacitors 10, 10', 11, 11' installed, the decoupling resistors 12, 12', 17, 17' can be set to substantially zero Ohms. In this case, the differential transimpedance amplifier circuit DTA sets the voltages at the differential signal input line 8, 8' and the differential signal input line 9, 9' substantially equal to the voltage at the guard node 2.

Option #2 (as illustrated in FIG. 1): Adding capacitor 10, 10' and capacitor 11, 11' which have substantially an impedance of zero Ohms at the operating or fundamental frequency of the electrical measurement signal. The decoupling resistors 12, 12', 17, 17' keep the differential transimpedance amplifier circuit DTA from becoming unstable due to the capacitive load at the differential signal input line 8, 8' and the differential signal input line 9, 9'. Option #2 has the advantage that substantially all electric currents injected from the outside, for example during a so-called BCI (bulk current injection) test are deviated away from the differential amplifiers 30, 30' into the guard node 2. Preferably, the resistor 12, 12' and the resistor 17, 17' have the same resistance value.

Option #2 alternatively allows the use of an embodiment of the complex current measurement circuit, wherein the common-mode voltage control input 31, 31' is connected to AC ground. All capacitors 10, 10', 11, 11' need to be assembled in this case.

An additional advantage of the embodiments of the complex current measurement circuit pursuant to FIG. 1 is that due to a symmetric signal processing path, electric currents injected from the outside that lie outside of the bandwidth of the demultiplexer circuit DMX appear as common-mode currents at the differential signal input line 8, 8' and the differential signal input line 9, 9', and are substantially eliminated at the differential signal output of the differential transimpedance amplifier circuit DTA.

The voltage difference between the differential signal outputs of the differential transimpedance amplifier circuits DTA pursuant to FIG. 1 can be further processed by a differential signal chain comprising, for example, filters and amplifiers. Preferably, an analog-to-digital converter (ADC) with differential inputs can be connected to the differential signal output of the differential transimpedance amplifier circuit DTA or at the end of the differential signal processing chain, thereby preserving the differential nature of the signal processing over the whole chain, and thereby optimally reducing its susceptibility to external disturbance sources.

It is also possible to use only one of the differential output lines of the complex current measurement circuits pursuant to FIG. 1 for further processing. The common-mode suppression action of the differential transimpedance amplifier circuit would still be preserved.

The method for determining a complex sense current of a guard-sense capacitive sensor using the embodiments of the complex current measurement circuit pursuant to FIGS. 1 and 2 comprises steps as follows. In a first step, the periodic electric measurement signal is provided to the guard antenna electrode of the capacitive sensor. In a second step, a phase difference between the periodic signal voltage source 1 and the local oscillator 45, 54 is set to a first phase value such that an absolute value of one of the phases is a priori known. In a next step, a voltage difference at the differential signal output of the differential transimpedance amplifier circuit DTA is determined. In another step then, the phase difference between the periodic signal voltage source 1 and the local oscillator 45, 54 is set to a second phase value that is different from the first phase value. Then, in a next step a voltage difference at the differential signal output of the differential transimpedance amplifier circuit DTA is determined. In a next step, the results of the two measurements are used to calculate the value of the unknown complex impedance 4. With the known two absolute phases, and the known guard voltage, there is sufficient information available for calculating the unknown impedance 4.

Alternatively, if only the phase difference between the two phases is known, a reference measurement can be performed with an a priori known, remotely-switchable reference impedance electrically connected upstream of the signal input line of the demultiplexer circuit DMX in order to be able to calculate the unknown impedance 4.

Also, if there is a DC offset in the signal chain after the demultiplexer circuit DMX, further measurement steps can be introduced. By implementing an additional independent measurement, an additional unknown can be calculated, or eliminated. By combining the results of the additional measurements, the DC offset can be eliminated.

Alternatively to operating the periodic signal voltage source 1 and the local oscillator 45, 54 at the same operating or fundamental frequency, a frequency offset of a predetermined amount that is different from zero can be set up between them. Due to the mixing operation of the demultiplexer circuit DMX, the difference of these two frequencies appears as an intermediate frequency of the AC voltage at the differential signal output of the differential transimpedance amplifier circuit DTA. Amplitude and absolute phase of this intermediate frequency AC signal is dependent on the complex impedance of the unknown impedance 4. By electrically connecting a remotely-switchable reference impedance upstream of the signal input line of the demultiplexer circuit DMX, and by measuring again amplitude and phase, or I (in-phase) and Q (quadrature) components of the intermediate frequency signal, the complex impedance of the unknown impedance 4 can be calculated. The advantage of using an intermediate frequency is that any DC offsets of the signal chain are eliminated.

Figure 3:
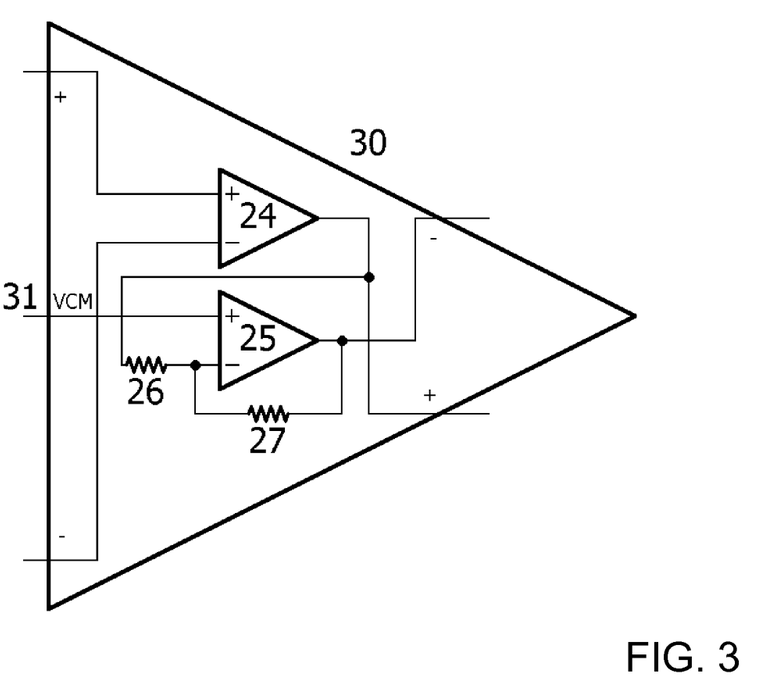
FIG. 3 is a layout of a possible embodiment of a differential amplifier for a differential transimpedance amplifier circuit of a complex current measurement circuit in accordance with the invention.

One option to design the differential amplifier 30, 30' shown in FIG. 1 is shown in FIG. 3. Operational amplifier 24 generates the output signal for the positive output of the differential amplifier 30. Operation amplifier 25 together with resistor 26 and resistor 27 invert the output of operational amplifier 24, using the common-mode voltage control input 31 as a reference, thereby generating the output signal for the negative output of the differential amplifier 30. Resistor 26 and resistor 27 preferably have the same value.

FIG. 2 shows a complex current measurement circuit, which allows the parallel measurement of the real and imaginary parts of the unknown impedance 4 by using only three demodulating switches 50, 51, 52 and three operational amplifiers 15, 20, 61. The demultiplexer circuit DMX comprises a plurality of three signal output lines. The demultiplexer 7 is symbolized by the three switches 50, 51, 52 and a sequencer 53. Switches 50, 51, 52 are turned on, one at a time, and one after the other by the sequencer 53, which is driven by the local oscillator 54. For instance, during the first third of the periodic electrical measurement signal, switch 50 is turned on. During the second third of the periodic electrical measurement signal, switch 51 is turned on. During the third third of the periodic electrical measurement signal, switch 52 is turned on. As the three demodulators consisting of respective switches 50, 51, 52 operate with a phase difference of 120 degrees, the resulting output voltages at differential signal outputs 16, 21, 62 are independent and can be used to calculate the in-phase and quadrature phase portions of the complex unknown current flowing through unknown impedance 4. The in-phase and the quadrature phase portions can then be used to calculate the value of the unknown impedance 4, as described above. For example, denoting the output voltages of differential signal outputs 16, 21, 62 by $V_{16}$, $V_{21}$, $V_{62}$, respectively, the in-phase voltage $V_i$ and the quadrature phase voltage $V_q$ can be calculated by:

$$V_i = \frac{V_{16} - V_{62}}{3}$$

-continued
$$V_q = \frac{V_{16} - 2 \cdot V_{21} + V_{62}}{3 \cdot \sqrt{3}}$$

Also, the switching frequency of the switches 50, 51, 52 (i.e. one third of the frequency of the local oscillator 54) can be set either to the same frequency as the periodic signal voltage source 1, or a frequency difference can be introduced, similar to the embodiment described above.

As described before, a CCII circuit conveys an input current at its input port 'X' to an output current at its output port 'Z'. The advantage of using a CCII circuit between the signal output lines of the demodulating demultiplexer circuit DMX and the differential amplifier 30 (FIG. 1) is that the CCII circuit presents an AC input impedance (at its 'X' port) to the demodulating demultiplexer circuit DMX, which can be made substantially smaller than the AC input impedance of the differential amplifier 30, 30'. This allows the reduction in capacitance value or even an elimination of capacitors 10, 10', 11, 11' in FIG. 2, which are expensive to integrate into an integrated circuit if their values are too high (e.g. above 100 pF, typically).

Also, the circuit in FIG. 2 can be improved by placing a CCII circuit between the signal output lines of the demodulating demultiplexer circuit DMX and the operational amplifiers 15, 20, 61, allowing the elimination or reduction of the value of the capacitors 10, 11, 60.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality, which is meant to express a quantity of at least two. The mere fact that certain measures are recited in mutually different dependent claims does not indicate that a combination of these measures cannot be used to advantage. Any reference signs in the claims should not be construed as limiting scope.

The invention claimed is:
1. A complex current measurement circuit that is configured to determine a complex sense current of a guard-sense capacitive sensor operated in loading mode, comprising:
   a periodic signal voltage source that is configured for providing a periodic electrical measurement signal at an output port that is electrically connectable to at least one guard antenna electrode of the capacitive sensor,
   a differential transimpedance amplifier circuit, comprising at least one electronic amplifier, at least two differential signal input lines and at least one signal output,
   a demultiplexer circuit comprising a demultiplexer, a signal input line, a plurality of signal output lines and a local oscillator for controlling switching operation, wherein at least one sense antenna electrode of the capacitive sensor is electrically connectable to the signal input line, and each one of the signal output lines is electrically connected to a different one of the at least two differential signal input lines of the differential transimpedance amplifier circuit, wherein when the demultiplexer circuit includes three signal output lines, the differential transimpedance amplifier circuit includes three operational amplifiers having a signal input port each, and wherein each signal output line of the demultiplexer circuit is electrically connected to a different one of the signal input ports of the three operational amplifiers; and when the demultiplexer circuit includes four signal output lines, the differential transimpedance amplifier circuit includes two differential amplifiers having two signal input ports each, and wherein each signal output line of the demultiplexer circuit is electrically connected to a different one of the signal input ports of the two operational amplifiers, and for each differential signal input line, either:
- a capacitor is electrically connected between the output port of the periodic signal voltage source and the differential signal input line, wherein an impedance of the capacitor at an operating frequency of the electrical measurement signal is lower than a predetermined value, or
- a galvanic connection is provided to a different one of the signal output lines of the demultiplexer circuit, wherein an output signal provided at the at least one differential signal output of the differential transimpedance amplifier circuit is usable for determining the complex sense current.

2. The complex current measurement circuit as claimed in claim 1, wherein the electrical measurement signal is formed as a sinusoidal voltage signal having a fundamental frequency in a range between 10 kHz and 100 MHz.

3. The complex current measurement circuit as claimed in claim 1, wherein the differential transimpedance amplifier circuit includes two or more operational amplifiers.

4. The complex current measurement circuit as claimed in claim 1, wherein the operating or fundamental frequency of the electrical measurement signal is equal to a switching operation frequency of the demultiplexer circuit within predetermined tolerance margins.

5. The complex current measurement circuit as claimed in claim 1, wherein the operating or fundamental frequency of the electrical measurement signal differs from a switching operation frequency of the demultiplexer circuit by a predetermined amount that is different from zero.

6. The complex current measurement circuit as claimed in claim 1, wherein the differential transimpedance amplifier circuit includes at least one current conveyor analog electronic device.

7. The complex current measurement circuit as claimed in claim 6, wherein the at least one current conveyor analog electronic device is built from discrete components.

8. A method for determining a complex sense current of a guard-sense capacitive sensor operated in loading mode using the complex current measurement circuit as claimed in claim 1, the method comprising steps of:
providing a periodic electric measurement signal to at least one guard antenna electrode of the capacitive sensor,
setting a phase difference between the periodic signal voltage source and a switching operation of the demultiplexer circuit to a first phase value such that an absolute value of one of the phases is a priori known,
then, determining a voltage at the differential signal output of the differential transimpedance amplifier circuit,
then, setting a phase difference between the periodic signal voltage source and a switching operation of the demultiplexer circuit to a second phase value that is different from the first phase value, and
then, determining a voltage at the differential signal output of the differential transimpedance amplifier circuit.

9. The method for determining a complex sense current according to claim 8, wherein the steps of determining a voltage at the differential signal output comprises determining a voltage difference at the differential signal output.

10. The method as claimed in claim 8, the method comprising steps of
providing a periodic electric measurement signal to at least one guard antenna electrode of the capacitive sensor,
then, determining a complex voltage difference at the differential signal output of the differential transimpedance amplifier circuit at a measuring frequency that is equal to a difference of the operating or fundamental frequency of the electrical measurement signal and the operating frequency of the local oscillator or a switching operation frequency of the demultiplexer circuit,
then, electrically connecting a remotely-switchable reference impedance upstream of the signal input line of the demultiplexer circuit, and
then, determining a complex voltage difference at the differential signal output of the differential transimpedance amplifier circuit at the measuring frequency.

11. The complex current measurement circuit as claimed in claim 1, wherein the predetermined value of the impedance of the capacitor at the operating frequency of the electrical measurement signal is between 100 Ohm and 10 mOhm.

* * * * *